United States Patent
Takamine

(10) Patent No.: US 10,270,426 B2
(45) Date of Patent: Apr. 23, 2019

(54) DUPLEXER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 244 days.

(21) Appl. No.: 15/379,522

(22) Filed: Dec. 15, 2016

(65) Prior Publication Data

US 2017/0099044 A1    Apr. 6, 2017

Related U.S. Application Data

(63) Continuation of application No. PCT/JP2015/067198, filed on Jun. 15, 2015.

(30) Foreign Application Priority Data

Jul. 22, 2014    (JP) .................................. 2014-149045

(51) Int. Cl.
  *H03H 9/05*    (2006.01)
  *H03H 9/10*    (2006.01)
  (Continued)

(52) U.S. Cl.
  CPC .......... *H03H 9/725* (2013.01); *H03H 9/0009* (2013.01); *H03H 9/02535* (2013.01);
  (Continued)

(58) Field of Classification Search
  CPC ............. H03H 9/0009; H03H 9/02535; H03H 9/0576; H03H 9/058; H03H 9/059;
  (Continued)

(56) References Cited

U.S. PATENT DOCUMENTS 5,561,406 A * 10/1996 Ikata .................... H03H 9/0576
                                                      333/126
2005/0264375 A1* 12/2005 Ikuta ...................... H03H 9/725
                                                      333/133

(Continued)

FOREIGN PATENT DOCUMENTS

JP    2010-068079 A  *  3/2010
JP    2011-172190 A    9/2011
(Continued)

OTHER PUBLICATIONS

Official Communication issued in corresponding International Application PCT/JP2015/067198, dated Jul. 21, 2015.

*Primary Examiner* — Barbara Summons
(74) *Attorney, Agent, or Firm* — Keating & Bennett, LLP

(57) ABSTRACT

At least one of a transmission filter and a reception filter of a duplexer includes a piezoelectric substrate, an elastic wave filter electrode portion on the piezoelectric substrate and including ground terminals to be connected to a ground potential, a support layer provided on the piezoelectric substrate, a cover provided on the support layer to seal a cavity in the support layer, and via hole electrodes penetrating the support layer and the cover and including first and second ends. The ground terminals are commonly connected on the piezoelectric substrate, and the ground terminals are electrically connected to the respective first ends of the plurality of via hole electrodes. The second ends of the via hole electrodes are connected to the ground potential outside of the at least one of the transmission filter and the reception filter.

17 Claims, 5 Drawing Sheets

(51) Int. Cl.
*H03H 9/64* (2006.01)
*H03H 9/72* (2006.01)
*H03H 9/02* (2006.01)
*H03H 9/00* (2006.01)

(52) U.S. Cl.
CPC ........ *H03H 9/0576* (2013.01); *H03H 9/1092* (2013.01); *H03H 9/64* (2013.01)

(58) Field of Classification Search
CPC ...... H03H 9/1071; H03H 9/1092; H03H 9/64; H03H 9/725
USPC .......................................... 333/133, 193–195
See application file for complete search history.

(56) References Cited

U.S. PATENT DOCUMENTS

2012/0032759 A1 2/2012 Nishii et al.
2013/0335171 A1 12/2013 Yamato et al.

FOREIGN PATENT DOCUMENTS

WO 2010/125873 A1 11/2010
WO 2012/120968 A1 9/2012

\* cited by examiner

DUPLEXER

CROSS REFERENCE TO RELATED APPLICATIONS

This application claims the benefit of priority to Japanese Patent Application No. 2014-149045 filed on Jul. 22, 2014 and is a Continuation Application of PCT Application No. PCT/JP2015/067198 filed on Jun. 15, 2015. The entire contents of each application are hereby incorporated herein by reference.

BACKGROUND OF THE INVENTION

1. Field of the Invention

The present invention relates to a duplexer having a WLP (Wafer Level Package) structure.

2. Description of the Related Art

Conventionally, an elastic wave filter device having a WLP structure is widely used as a bandpass filter or other suitable components for a cellular phone device.

Japanese Unexamined Patent Application Publication No. 2011-172190 discloses an example of an elastic wave filter device having a WLP structure. In the elastic wave filter device of Japanese Unexamined Patent Application Publication No. 2011-172190, a support layer is formed on a piezoelectric substrate so as to enclose an elastic wave filter electrode portion formed on the piezoelectric substrate. A cover is provided on the support layer so as to seal a cavity in the support layer. A plurality of via hole electrodes are provided so as to penetrate the support layer and the cover. The elastic wave filter electrode portion includes a plurality of ground terminals to be connected to a ground potential, and the plurality of ground terminals are electrically connected to the plurality of via hole electrodes.

However, in the elastic wave filter device described in Japanese Unexamined Patent Application Publication No. 2011-172190, a large inductance is present between the ground terminals and the ground potential due to the plurality of via hole electrodes. Therefore, the isolation characteristics cannot be increased to a sufficient level.

In addition, in a conventional elastic wave filter device having unbalanced input-unbalanced output, in particular, the isolation characteristics cannot be enhanced to a sufficient level.

SUMMARY OF THE INVENTION

Preferred embodiments of the present invention provide a duplexer that has improved isolation characteristics.

A duplexer according to a preferred embodiment of the present invention includes a transmission filter and a reception filter, and at least one of the transmission filter and the reception filter includes a piezoelectric substrate, an elastic wave filter electrode portion provided on the piezoelectric substrate so as to define an elastic wave filter and including a plurality of ground terminals to be connected to a ground potential, a support layer including a cavity that encloses the elastic wave filter electrode portion and provided on the piezoelectric substrate, a cover provided on the support layer so as to seal the cavity in the support layer, and a plurality of via hole electrodes that penetrate the support layer and the cover and including first and second ends. The plurality of ground terminals are commonly connected on the piezoelectric substrate, and the plurality of ground terminals are electrically connected to the respective first ends of the plurality of via hole electrodes. The second ends of the plurality of via hole electrodes are the elastic wave filter connected to the ground potential outside of the at least one of the transmission filter and the reception filter.

In a duplexer according to a preferred embodiment of the present invention, the reception filter is the elastic wave filter.

In a duplexer according to a preferred embodiment of the present invention, bumps are bonded to the respective second ends of the plurality of via hole electrodes.

In a duplexer according to a preferred embodiment of the present invention, the elastic wave filter electrode portion includes a longitudinally coupled resonator elastic wave filter.

In a duplexer according to a preferred embodiment of the present invention, the longitudinally coupled resonator elastic wave filter includes an unbalanced input terminal and an unbalanced output terminal.

In a duplexer according to a preferred embodiment of the present invention, the longitudinally coupled resonator elastic wave filter includes a single stage configuration.

In a duplexer according to a preferred embodiment of the present invention, an input terminal and an output terminal are provided on the piezoelectric substrate, a first parallel arm resonator is connected at one end to a node between the input terminal and the elastic wave filter electrode portion and connected at another end to the via hole electrodes, and a second parallel arm resonator is connected at one end to an end of the elastic wave filter electrode portion on the output terminal side and connected at another end to the via hole electrodes.

According to various preferred embodiments of the present invention, duplexers having improved isolation characteristics are provided.

The above and other elements, features, steps, characteristics and advantages of the present invention will become more apparent from the following detailed description of the preferred embodiments with reference to the attached drawings.

BRIEF DESCRIPTION OF THE PREFERRED EMBODIMENTS

Hereinafter, specific preferred embodiments of the present invention will be described with reference to the drawings.

Figure 1:
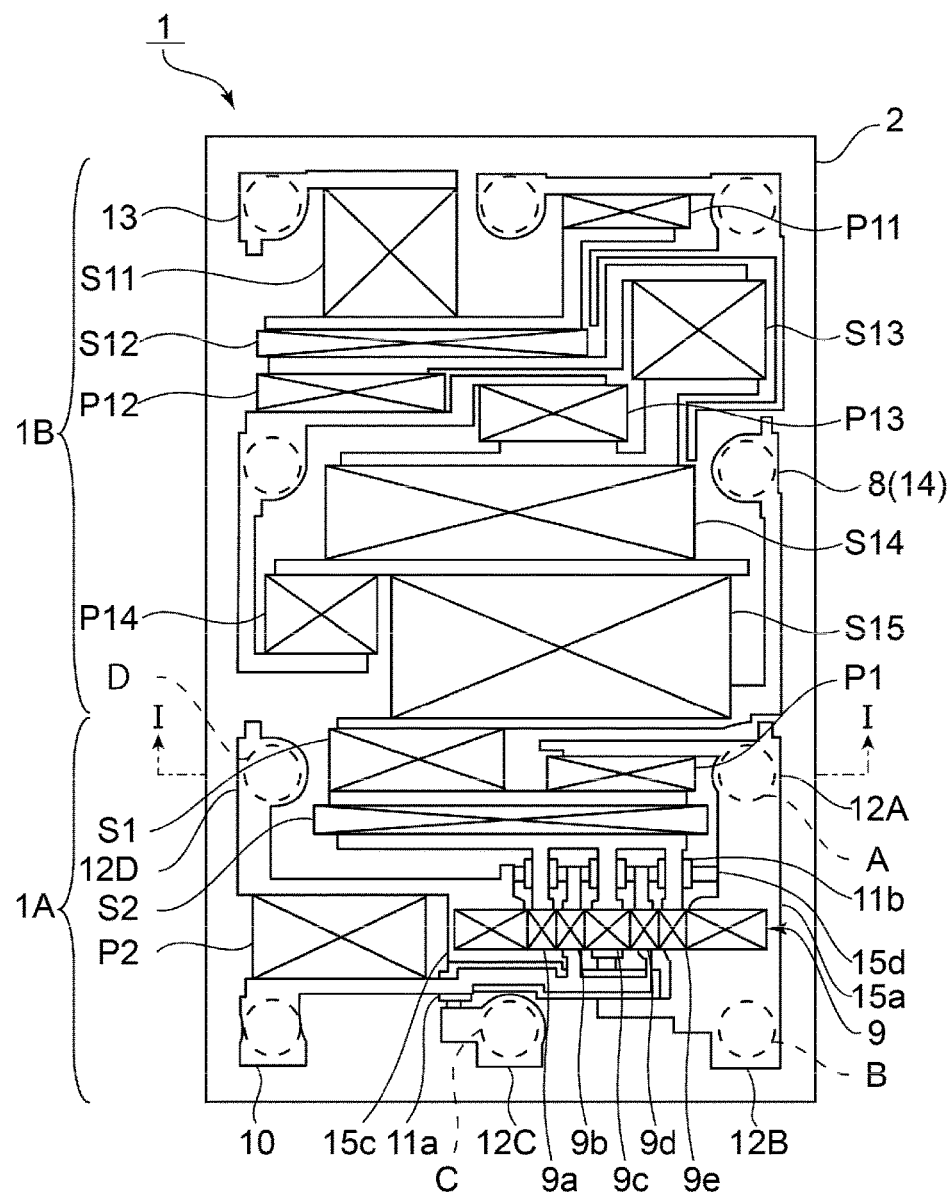
FIG. 1 is a schematic plan view illustrating a piezoelectric substrate in a duplexer according to a first preferred embodiment of the present invention and an electrode structure on the piezoelectric substrate.
Figure 2:
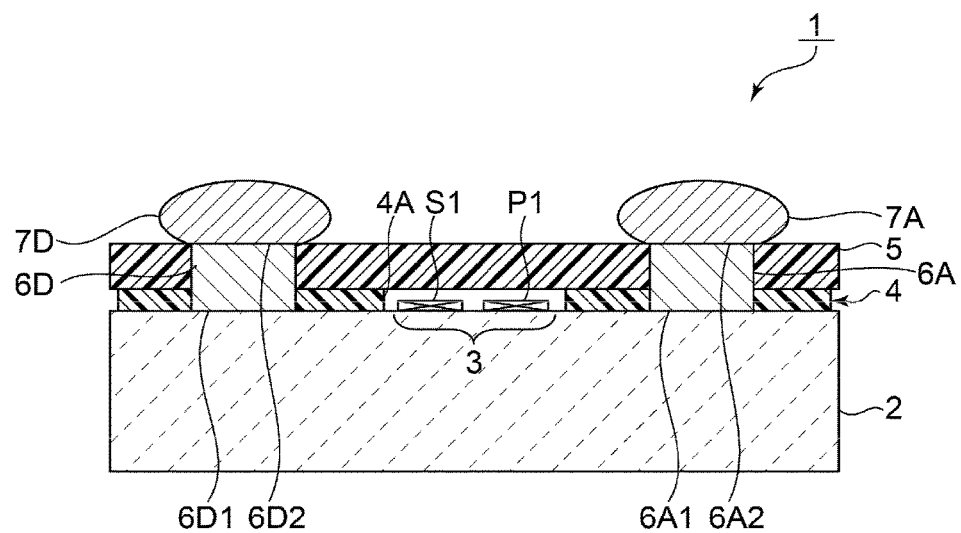
FIG. 2 is a schematic sectional view of the duplexer at a portion corresponding to a section along the I-I line in FIG. 1.

FIG. 1 is a schematic plan view illustrating a piezoelectric substrate included in a duplexer according to a first preferred embodiment of the present invention and an electrode structure on the piezoelectric substrate. FIG. 2 is a schematic sectional view of the duplexer at a portion corresponding to a section along the I-I line in FIG. 1.

A duplexer 1 includes a piezoelectric substrate 2. The piezoelectric substrate 2 is preferably made of a piezoelectric single crystal, such as $LiNbO_3$ or $LiTaO_3$, for example. It is to be noted that the piezoelectric substrate 2 may instead be made of piezoelectric ceramics.

As illustrated in FIG. 2, an elastic wave filter electrode portion 3 is provided on the piezoelectric substrate 2 so as to define an elastic wave filter. The elastic wave filter electrode portion 3 includes a plurality of elastic wave resonators including a series arm resonator S1 and a parallel arm resonator P1, which will be described later. Each of the elastic wave resonators includes an interdigital transducer electrode and a reflector. The reflector is provided on each side of the interdigital transducer electrode in the propagation direction of a surface acoustic wave. The interdigital transducer electrode and the reflector are made of an appropriate metal or alloy, for example.

A support layer 4 is provided on the piezoelectric substrate 2 so as to include a cavity 4A that encloses the elastic wave filter electrode portion 3. The support layer 4 is made of an appropriate resin, for example. The support layer 4 can be formed, for example, through a photolithography process.

A cover 5 is provided on the support layer 4 so as to seal the cavity 4A in the support layer 4. The cover 5 is made of an appropriate resin, for example.

First and fourth via hole electrodes 6A and 6D are structured so as to penetrate the support layer 4 and the cover 5. The first and fourth via hole electrodes 6A and 6D are made of an appropriate metal or alloy, for example. When forming the first and fourth via hole electrodes 6A and 6D, via holes are first formed in the support layer 4 and the cover 5 through laser irradiation. Then, the via holes are filled with a conductor through an electrolytic plating process or other suitable process.

The first via hole electrode 6A includes first and second ends 6A1 and 6A2. The fourth via hole electrode 6D includes first and second ends 6D1 and 6D2. The first ends 6A1 and 6D1 are the ends that are located on the side toward the piezoelectric substrate 2. The second ends 6A2 and 6D2 are the ends that are located on the side toward the cover 5. First and fourth bumps 7A and 7D are bonded, respectively, to the second ends 6A2 and 6D2 of the first and fourth via hole electrodes 6A and 6D. The first and fourth bumps 7A and 7D are made of an appropriate blazing filler metal, for example. It is to be noted that, although not illustrated in FIG. 2, a plurality of via hole electrodes including second and third via hole electrodes, in addition to the first and fourth via hole electrodes 6A and 6D, are provided in the duplexer 1 of the present preferred embodiment. The plurality of via hole electrodes each include first and second ends, similarly to the first and fourth via hole electrodes 6A and 6D. A plurality of bumps including second and third bumps are bonded to the respective second ends of the plurality of via hole electrodes including the second and third via hole electrodes.

Referring back to FIG. 1, the duplexer 1 includes a first band pass filter 1A and a second band pass filter 1B whose pass band differs from the pass band of the first band pass filter 1A. The elastic wave filter electrode portion 3 schematically illustrated in FIG. 2 defines the first and second band pass filters 1A and 1B illustrated in FIG. 1. Here, the first band pass filter 1A is a reception filter, and the second band pass filter 1B is a transmission filter.

Figure 3:
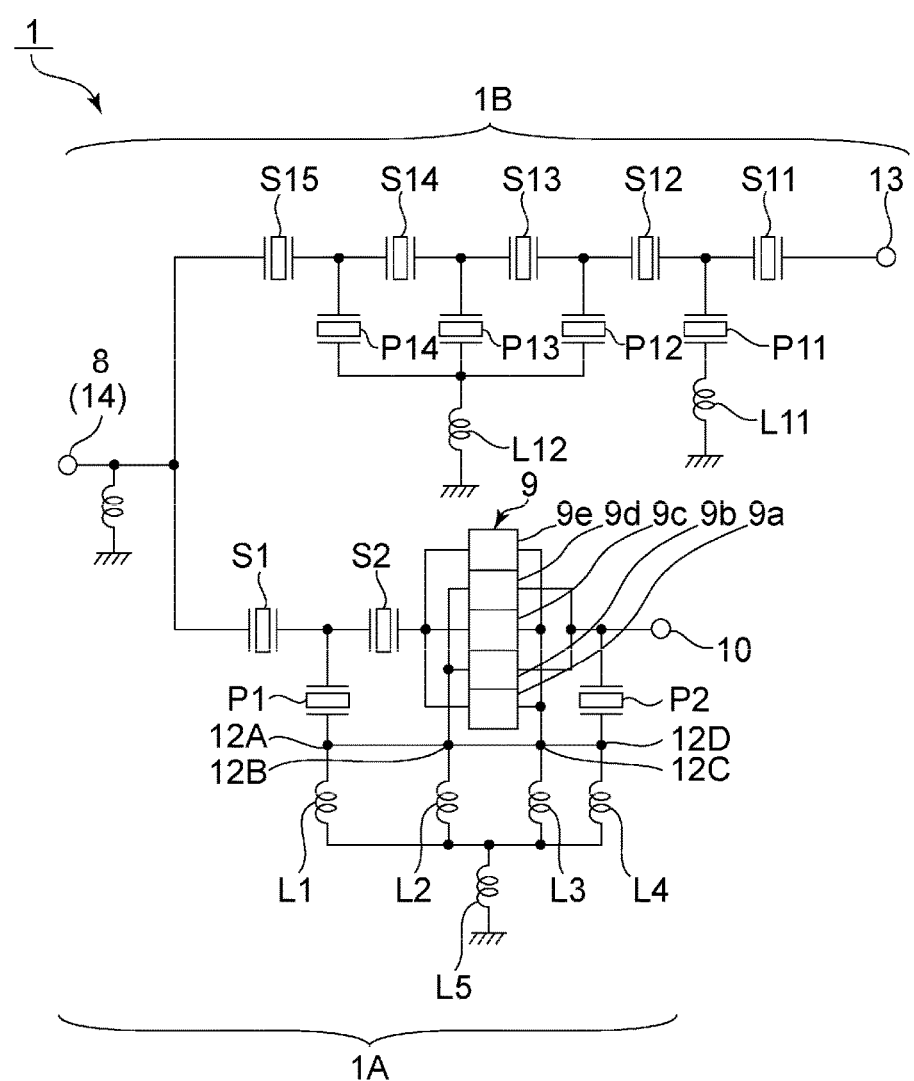
FIG. 3 is a circuit diagram of a state in which the duplexer according to the first preferred embodiment of the present invention is mounted on a circuit board.

FIG. 3 is a circuit diagram of a state in which the duplexer according to the first preferred embodiment of the present invention is mounted on a circuit board.

The first band pass filter 1A of the duplexer 1 includes an input terminal 8, an output terminal 10, and ground terminals 12A through 12D that define a plurality of ground terminals. Series arm resonators S1 and S2 and a longitudinally coupled resonator elastic wave filter 9 are connected in series between the input terminal 8 and the output terminal 10. A first parallel arm resonator P1 is connected between the ground terminal 12A and a node between the series arm resonator S1 and the series arm resonator S2. A second parallel arm resonator P2 is connected between the ground terminal 12D and a node between the longitudinally coupled resonator elastic wave filter 9 and the output terminal 10.

The longitudinally coupled resonator elastic wave filter 9 includes first through fifth interdigital transducer electrodes 9a through 9e. The first through fifth interdigital transducer electrodes 9a through 9e each include a pair of busbars. Ends of a plurality electrode fingers are in common connection to each of the pairs of busbars. A plurality of electrode fingers connected to one of the busbars and a plurality electrode fingers connected to the other one of the busbars are interposed between each other. One of the busbars of each of the first through fifth interdigital transducer electrodes 9a through 9e is connected to a hot side, and the other one of the busbars is connected to a ground side.

To be more specific, one of the busbars of each of the first, third, and fifth interdigital transducer electrodes 9a, 9c, and 9e is in common connection to the series arm resonator S2, and the other one of the busbars is connected to a ground terminal. Therefore, the first, third, and fifth interdigital transducer electrodes 9a, 9c, and 9e are in common connection to the input terminal 8 with the series arm resonator S2 and the series arm resonator S1 interposed therebetween. One of the busbars of each of the second and fourth interdigital transducer electrodes 9b and 9d is in common connection to the output terminal 10, and the other one of the busbars is connected to a ground terminal. The longitudinally coupled resonator elastic wave filter 9 is preferably an unbalanced input-unbalanced output longitudinally coupled resonator elastic wave filter including an unbalanced input terminal and an unbalanced output terminal.

The ground terminals 12A through 12D are connected to first through fourth inductors L1 through L4, respectively. The first through fourth inductors L1 through L4 are in common connection to an external inductor L5. The external inductor L5 is connected to a ground potential.

The first through fourth inductors L1 through L4 are preferably defined by the inductances of the first through fourth via hole electrodes and the first through fourth bumps.

The second band pass filter 1B of the duplexer 1 is preferably a ladder filter. The second band pass filter 1B includes an input terminal 13 and an output terminal 14. The output terminal 14 of the second band pass filter 1B also functions as the input terminal 8 of the first band pass filter 1A. Series arm resonators S11 through S15 are connected in series between the input terminal 13 and the output terminal 14. A parallel arm resonator P11 is connected between a ground potential and a node between the series arm resonator S11 and the series arm resonator S12. The parallel arm resonator P11 is connected to the ground potential with an inductor L11 interposed therebetween. A parallel arm resonator P12 is connected between a ground potential and a node between the series arm resonator S12 and the series arm resonator S13. A parallel arm resonator P13 is connected between the ground potential and a node between the series arm resonator S13 and the series arm resonator S14. A parallel arm resonator P14 is connected between the ground potential and a node between the series arm resonator S14 and the series arm resonator S15. The parallel arm resonators P12 through P14 are in common connection to the ground potential with an inductor L12 interposed therebetween.

Here, referring back to FIG. 1, the input terminals 8 and 13, the output terminals 10 and 14, and the ground terminals 12A through 12D are provided on the piezoelectric substrate 2. In addition, the series arm resonators S1, S2, and S11 through S15, the first and second parallel arm resonators P1 and P2, the parallel arm resonators P11 through P14, and the longitudinally coupled resonator elastic wave filter 9 are provided on the piezoelectric substrate 2.

The first ends of the first through fourth via hole electrodes are bonded to respective portions indicated by dashed lines A through D in the ground terminals 12A through 12D. The ground terminals 12A through 12D are electrically connected to the first through fourth via hole electrodes, respectively. In addition, the first ends of the plurality of via hole electrodes are bonded to respective portions indicated by dashed lines in the input terminal 8, the output terminal 10, and other terminals.

Connection wires 15a, 15c, and 15d and an unillustrated connection wire are provided on the piezoelectric substrate 2. The unillustrated connection wire is hidden by an interlayer insulating film 11a when viewed from the above. The ground terminal 12A and the ground terminal 12B are connected to each other by the connection wire 15a. The ground terminal 12B and the ground terminal 12C are connected to each other by the unillustrated connection wire. The ground terminal 12C and the ground terminal 12D are connected to each other by the connection wire 15c. Each wire connecting the longitudinally coupled resonator elastic wave filter 9 and the output terminal 10, the connection wires 15a and 15c, and the aforementioned unillustrated connection wire are prevented from making contact with one another by the interlayer insulating film 11a. The ground terminal 12D and the ground terminal 12A are connected to each other by the connection wire 15d. Each wire connecting the longitudinally coupled resonator elastic wave filter 9 and the series arm resonator S2 and the connection wire 15d are prevented from making contact with one another by an interlayer insulating film 11b. In this manner, the ground terminals 12A through 12D are electrically in common connection on the piezoelectric substrate 2.

In the present preferred embodiment, the ground terminals 12A through 12D are in common electrical connection on the piezoelectric substrate 2. With this configuration, the isolation characteristics are significantly improved. This will be described hereinafter. It is to be noted that the isolation characteristics refer to the attenuation characteristics between the input terminal 13 and the output terminal 10.

The first and fourth inductors L1 and L4 illustrated in FIG. 3 are defined by the inductances of the first and fourth via hole electrodes 6A and 6D and the first and fourth bumps 7A and 7D illustrated in FIG. 2. The dimension of the first and fourth via hole electrodes 6A and 6D and the first and fourth bumps 7A and 7D along the thickness direction is preferably greater than the dimension of the support layer 4 and the cover 5 along the thickness direction. Therefore, the first and fourth via hole electrodes 6A and 6D and the first and fourth bumps 7A and 7D function as inductors having large inductances. In a similar manner, the second and third inductors L2 and L3 illustrated in FIG. 3 are defined by the inductances of the second and third via hole electrodes and the second and third bumps.

The duplexer 1 of the present preferred embodiment is mounted on a circuit board. In other words, the duplexer 1 is bonded to ground terminals on the circuit board with the first through fourth bumps interposed therebetween. The external inductor L5 illustrated in FIG. 3 is defined by the inductances of the ground terminals and ground wires on the circuit board.

Ends of the first through fourth inductors L1 through L4 on the side that is not connected to the ground terminals 12A through 12D are in common connection to the external inductor L5. In addition, as the ground terminals 12A and 12D are in common connection, the first through fourth inductors L1 through L4 are connected in parallel to one another.

Figure 4:
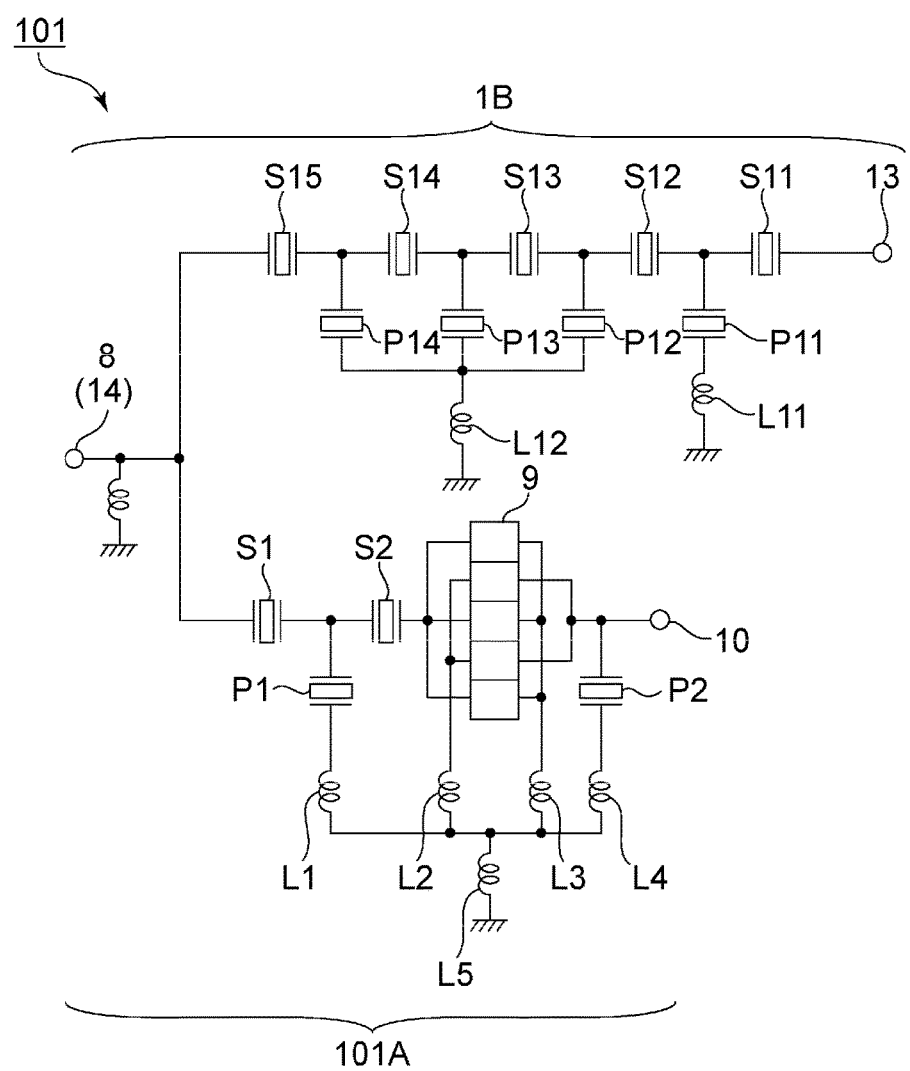
FIG. 4 is a circuit diagram of a state in which a comparative example of a duplexer of a preferred embodiment of the present invention is mounted on a circuit board.

FIG. 4 is a circuit diagram of a state in which a comparative example of a duplexer according to a preferred embodiment on the present invention is mounted on a circuit board.

As can be seen clearly from FIG. 4, first through fourth inductors L1 through L4 of a duplexer 101 of the comparative example are not connected in parallel to one another. Therefore, the sum of the inductances of the first through fourth inductors L1 through L4 becomes large. In contrast, the first through fourth inductors L1 through L4 of the present preferred embodiment are connected in parallel to one another, and thus, the sum of the inductances is small. For example, where the inductances of the first through fourth inductors L1 through L4 are the same or substantially the same, the sum of the inductances of the first through fourth inductors L1 through L4 in the present preferred embodiment is about 1/16 of that of the comparative example. In this manner, the sum of the inductances of the plurality of inductors connected to the ground terminals 12A through 12D is reduced to a great extent.

Next, the inventor of the present application fabricated a duplexer according to the present preferred embodiment and a duplexer for comparison and examined the attenuation. The number of pairs of electrode fingers and the cross width of the first through fifth interdigital transducer electrodes 9a through 9e of the longitudinally coupled resonator elastic wave filter 9, the series arm resonators S1 and S2, and the first and second parallel arm resonators P1 and P2 are set as indicated in Table 1 below. The number of electrode fingers of each of the reflectors is set as indicated in Table 1. The duty of the first through fifth interdigital transducer electrodes 9a through 9e, the series arm resonators S1 and S2, the first and second parallel arm resonators P1 and P2, and each of the reflectors is set as indicated in Table 1. In addition, the wave length defined by each of the first through fifth interdigital transducer electrodes 9a through 9e, the series arm resonators S1 and S2, the first and second parallel arm resonators P1 and P2, and the reflectors is set as indicated in Table 1. The interval between the interdigital transducer electrodes of the longitudinally coupled resonator elastic wave filter 9 is set as indicated in Table 2 below with the wave length defined by the reflectors represented by XR.

TABLE 1

|  |  | cross width | wave length | the number of pairs or the number of electrode fingers | duty |
|---|---|---|---|---|---|
| longitudinally coupled resonator elastic wave filter | first IDT electrode 9a | 50 μm | 1.95 μm | 20 pairs | 0.5 |
|  | second IDT electrode 9b | 50 μm | 1.93 μm | 18 pairs | 0.5 |
|  | third IDT electrode 9c | 50 μm | 1.98 μm | 25 pairs | 0.5 |
|  | fourth IDT electrode 9d | 50 μm | 1.93 μm | 18 pairs | 0.5 |
|  | fifth IDT electrode 9e | 50 μm | 1.95 μm | 20 pairs | 0.5 |
|  | reflector |  | 1.97 μm | 75 | 0.5 |
| series arm resonator S1 | IDT electrode | 30 μm | 1.92 μm | 125 pairs | 0.5 |
|  | reflector |  | 1.92 μm | 31 | 0.5 |
| series arm resonator S2 | IDT electrode | 30 μm | 1.92 μm | 227 pairs | 0.5 |
|  | reflector |  | 1.92 μm | 31 | 0.5 |
| first parallel arm resonator P1 | IDT electrode | 56 μm | 1.98 μm | 70 pairs | 0.5 |
|  | reflector |  | 1.98 μm | 31 | 0.5 |
| second parallel arm resonator P2 | IDT electrode | 38 μm | 1.98 μm | 70 pairs | 0.5 |
|  | reflector |  | 1.98 μm | 31 | 0.5 |

TABLE 2

|  | interval |
|---|---|
| between first IDT electrode 9a and second IDT electrode 9b | 0.33λR |
| between second IDT electrode 9b and third IDT electrode 9c | 0.30λR |
| between third IDT electrode 9c and fourth IDT electrode 9d | 0.30λR |
| between fourth IDT electrode 9d and fifth IDT electrode 9e | 0.33λR |

In addition, the duplexer for comparison has a circuit configuration similar to that of the duplexer 101 illustrated in FIG. 4. In other words, the duplexer for comparison has the same or similar circuit configuration as the duplexer of the present preferred embodiment except that the first through fourth inductors L1 through L4 are not connected in parallel to one another.

Figure 5:
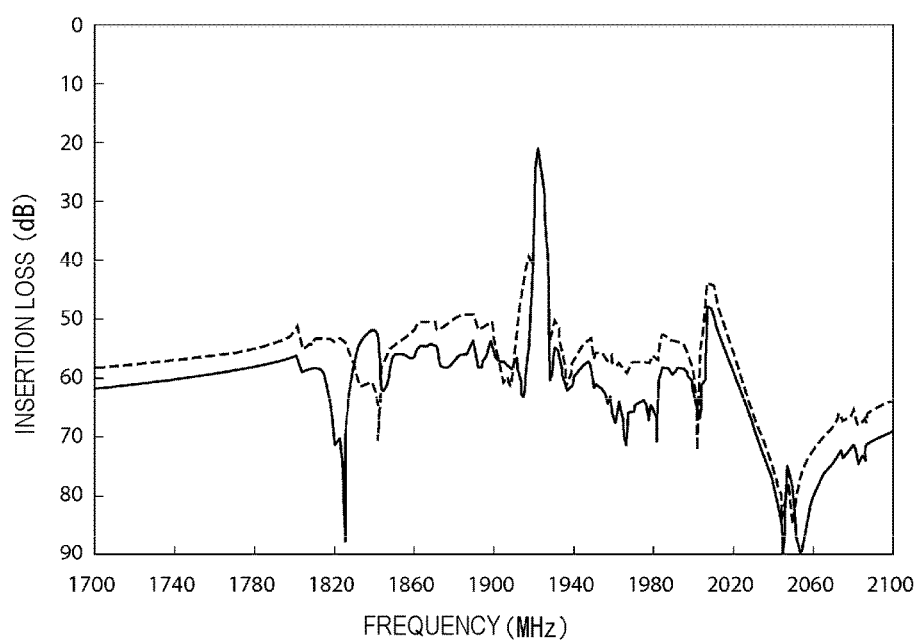
FIG. 5 illustrates frequency characteristics of attenuation of the duplexer according to the first preferred embodiment of the present invention and of the comparative example thereof.

FIG. 5 illustrates frequency characteristics of the attenuation of the duplexer according to the first preferred embodiment of the present invention and of the comparative example. The solid line indicates the frequency characteristics of the attenuation in the first preferred embodiment, and the dashed line indicates the frequency characteristics of the attenuation in the comparative example.

As illustrated in FIG. 5, the isolation characteristics are further enhanced in a transmission band on the lower band side of the communication band in the present preferred embodiment.

In the comparative example, as described above, the sum of the inductances of the inductors connected to the ground potential is large. Therefore, a ground current of the transmission filter is transmitted to the reception filter through a ground path, and the isolation characteristics deteriorate due to the influence of the ground current.

In contrast, the sum of the inductances of the inductors connected to the ground potential is further reduced in the present preferred embodiment. Thus, the isolation characteristics are further improved.

It is to be noted that the longitudinally coupled resonator elastic wave filter 9 illustrated in FIG. 1 may include a plurality of stages. Although, preferred embodiments of the present invention can be more suitably applied in the case in which the longitudinally coupled resonator elastic wave filter 9 includes a single stage, as in the present preferred embodiment.

In addition, the first band pass filter 1A illustrated in FIG. 1 is a reception filter in the present preferred embodiment. However, the first band pass filter 1A may be a transmission filter. By applying preferred embodiments of the present invention in the transmission filter as well, the isolation characteristics are effectively and reliably improved.

As described above, conventionally, it has not been possible to improve the isolation characteristics with an unbalanced input-unbalanced output longitudinally coupled resonator elastic wave filter. However, with the unbalanced input-unbalanced output longitudinally coupled resonator elastic wave filter according to a preferred embodiment of the present invention, the sum of the inductances of the inductors connected to the ground potential is further reduced. Thus, the isolation characteristics of the unbalanced input-unbalanced output longitudinally coupled resonator elastic wave filter are effectively and reliably improved.

It is to be noted that the longitudinally coupled resonator elastic wave filter 9 is not limited to an unbalanced input-unbalanced output longitudinally coupled resonator elastic wave filter. Although, the present invention is more effective in an unbalanced input-unbalanced output longitudinally coupled resonator elastic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer, comprising:
a transmission filter; and
a reception filter; wherein
at least one of the transmission filter and the reception filter includes:
 a piezoelectric substrate;
 an elastic wave filter electrode portion provided on the piezoelectric substrate to define an elastic wave filter and including a plurality of ground terminals to be connected to a ground potential;
 a support layer including a cavity that encloses the elastic wave filter electrode portion, the support layer being provided on the piezoelectric substrate;
 a cover provided on the support layer so as to seal the cavity in the support layer; and
 a plurality of via hole electrodes penetrating the support layer and the cover, and including first and second ends;
the plurality of ground terminals are commonly connected on the piezoelectric substrate, the plurality of ground terminals are electrically connected to the respective first ends of the plurality of via hole electrodes, and the second ends of the plurality of via hole electrodes are connected to the ground potential outside of the at least one of the transmission filter and the reception filter; and the duplexer includes:
an input terminal and an output terminal that are provided on the piezoelectric substrate;
a first parallel arm resonator that is connected at one end to a node between the input terminal and the elastic wave filter electrode portion and connected at another end to the plurality of via hole electrodes; and
a second parallel arm resonator that is connected at one end to an end of the elastic wave filter electrode portion on the output terminal side and connected at another end to the plurality of via hole electrodes.

2. The duplexer according to claim 1, wherein the reception filter is the elastic wave filter.

3. The duplexer according to claim 1, wherein a bump is bonded to each of the second ends of the plurality of via hole electrodes.

4. The duplexer according to claim 3, wherein the plurality of via hole electrodes and the bump bonded to each of the second ends of the plurality of via hole electrodes define a plurality of inductors.

5. The duplexer according to claim 4, wherein the plurality of inductors are connected to one another in parallel.

6. The duplexer according to claim 1, wherein the elastic wave filter electrode portion includes a longitudinally coupled resonator elastic wave filter.

7. The duplexer according to claim 6, wherein the longitudinally coupled resonator elastic wave filter includes an unbalanced input terminal and an unbalanced output terminal.

8. The duplexer according to claim 6, wherein the longitudinally coupled resonator elastic wave filter includes a single stage configuration.

9. The duplexer according to claim 6, wherein the longitudinally coupled resonator elastic wave filter includes first through fifth interdigital transducer electrodes.

10. The duplexer according to claim 1, further comprising:
a plurality of connection wires provided on the piezoelectric substrate; wherein
the plurality of connection wires connect respective pairs of the plurality of ground terminals to one another.

11. The duplexer according to claim 1, wherein the elastic wave filter electrode portion includes a plurality of elastic wave resonators including at least one series arm resonator and a plurality of parallel arm resonators that include the first parallel arm resonator and the second parallel arm resonator.

12. The duplexer according to claim 11, wherein each of the plurality of elastic wave resonators includes an interdigital transducer electrode and a reflector.

13. The duplexer according to claim 1, wherein the support layer is made of resin.

14. The duplexer according to claim 1, wherein the cover is made of resin.

15. The duplexer according to claim 1, wherein
the reception filter is defined by a first band pass filter and the transmission filter is defined by a second band pass filter.

16. The duplexer according to claim 15, wherein a pass band of the first band pass filter is different from a pass band of the second band pass filter.

17. The duplexer according to claim 15, wherein the second band pass filter is a ladder filter.

* * * * *